(12) United States Patent
Rice et al.

(10) Patent No.: US 8,773,854 B2
(45) Date of Patent: Jul. 8, 2014

(54) THERMOSIPHON SYSTEMS FOR ELECTRONIC DEVICES

(75) Inventors: Jeremy Rice, San Jose, CA (US); Bill Dailey, Redwood City, CA (US); Jeffrey Spaulding, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/093,609

(22) Filed: Apr. 25, 2011

(65) Prior Publication Data

US 2012/0268877 A1    Oct. 25, 2012

(51) Int. Cl.
*H05K 7/20* (2006.01)
*F28D 15/00* (2006.01)

(52) U.S. Cl.
USPC ............. 361/700; 361/679.47; 361/679.53; 165/104.21; 165/104.33

(58) Field of Classification Search
USPC .......... 361/699–700, 679.47, 679.52, 679.53; 165/104.21, 104.33; 257/714–715, 257/E23.088; 174/15.2
See application file for complete search history.

(56) References Cited

U.S. PATENT DOCUMENTS

| | | | | |
|---|---|---|---|---|
| 5,076,351 A | * | 12/1991 | Munekawa et al. | 165/104.21 |
| 5,216,580 A | * | 6/1993 | Davidson et al. | 361/700 |
| 5,390,077 A | * | 2/1995 | Paterson | 361/700 |
| 5,634,270 A | * | 6/1997 | Lu | 29/890.046 |
| 6,633,484 B1 | | 10/2003 | Lee et al. | |
| 6,917,522 B1 | | 7/2005 | Erturk et al. | |
| 7,012,807 B2 | * | 3/2006 | Chu et al. | 361/699 |
| 8,130,497 B2 | * | 3/2012 | Kondo et al. | 361/700 |
| 2007/0246193 A1 | * | 10/2007 | Bhatti et al. | 165/104.21 |
| 2008/0110599 A1 | * | 5/2008 | Reyzin et al. | 165/104.33 |
| 2008/0247137 A1 | * | 10/2008 | Dautert et al. | 361/703 |
| 2010/0073863 A1 | * | 3/2010 | Matsushima et al. | 361/679.46 |
| 2011/0277967 A1 | * | 11/2011 | Fried et al. | 165/104.26 |

* cited by examiner

*Primary Examiner* — Zachary M Pape
(74) *Attorney, Agent, or Firm* — Fish & Richardson P.C.

(57) ABSTRACT

A thermosiphon system includes a condenser and an evaporator fluidically coupled to the condenser by a condensate line. The evaporator includes a housing having an opening to the condensate line, a wick located in the housing, and a flow restrictor located in the housing configured to restrict flow of a working fluid from the condensate line onto a portion of the wick.

23 Claims, 5 Drawing Sheets

THERMOSIPHON SYSTEMS FOR ELECTRONIC DEVICES

TECHNICAL FIELD

This invention relates to thermosiphon systems to remove heat from electronic devices.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, and other heat generating devices) that are located on a server rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

As noted above, electronic devices, e.g., computer components, such as processors and memories, generate heat. A thermosiphon system can be used to remove heat from such an electronic device. Although some systems have been proposed for removing heat from computer components, the limited space available in the server rack environment introduces an additional challenge to thermosiphon system design. In addition, for commercial applicability, the thermosiphon needs to operate with high efficiency.

Several approaches are described, which can be used individually or in combination in order to improve efficiency. The condenser can have multiple vertical chambers, but lack a top header in order to fit within the limited vertical space of the server rack. The inner surfaces of the condenser can include undulations that reduce thermal resistance across the liquid film in the condenser. A flow restrictor in the evaporator can be used to form a thin layer of liquid in the evaporator over the region where the evaporator contacts the electronic device, thus reducing thermal resistance of the evaporator.

In one aspect, a thermosiphon system includes a condenser and an evaporator fluidically coupled to the condenser by a condensate line. The evaporator includes a housing having an opening to the condensate line, a wick located in the housing, and a flow restrictor located in the housing configured to restrict flow of a working fluid from the condensate line onto a portion of the wick.

Implementations can include one or more of the following. The housing may have a bottom interior surface, the wick may be positioned on the bottom interior surface, and the flow restrictor may include a fluid-impermeable barrier on the bottom interior surface between the wick and the opening. The barrier may have a plurality of apertures therethrough to permit the working fluid to flow to the wick. The plurality of apertures through the barrier may be positioned adjacent the bottom interior surface. The bottom interior surface may be a planar surface. The fluid-impermeable barrier may dam the working fluid so that the working fluid pools on a side of the barrier closer to the opening. The flow restrictor may be configured such that a depth of the working fluid is greater over a region of the housing between the barrier and the opening than over the portion of the wick. The fluid-impermeable barrier may surround the portion of the wick. The housing may include a top interior surface and there may be a gap between the barrier and the interior top surface of the housing. A vapor line may fluidically couple the evaporator to the condenser, an opening in the housing to the vapor line may be located in an interior top surface of the housing, and the opening in the housing to the condensate line may be located in an interior side surface of the housing. The condensate line may include a combined condensate and vapor transfer line, and fluidical coupling between the evaporator and the condenser may consist of the combined condensate and vapor transfer line.

In another aspect, a thermosiphon system includes an evaporator, a condenser comprising a plurality of parallel vertically-extending chambers, the chambers having closed off top ends, and a condensate line fluidically coupling the condenser to the evaporator.

Implementations can include one or more of the following features. The condenser may include a bottom header and a plurality of condensate tubes projecting upwardly from the bottom header, and the plurality of parallel vertically-extending chambers may be located within the plurality of condensate tubes. The condensate line may fluidically couples the bottom header of the condenser to the evaporator. The condenser does not include a top header. The condenser may include a plurality of heat conducting fins projecting outwardly from the condensate tubes. The condensate tubes may extend perpendicular to the bottom header and the heat conducting fins may extend parallel to the bottom header. The condenser may include a body having a cavity formed therein and a plurality of walls in the cavity that divide the cavity into the plurality of parallel vertically-extending chambers. The plurality of vertically-extending chambers may extend laterally from a central channel. A first set of the plurality of vertically-extending chambers may extend laterally from a first side of the central channel, and a second set of the plurality of vertically-extending chambers may extend laterally from an opposite second side of the central channel. A plurality of heat conducting fins may project outwardly from the body. The plurality of heat conducting fins may project vertically from the body. The plurality of heat conducting fins may be oriented perpendicular to the vertically-extending chambers.

In another aspect, a thermosiphon system includes an evaporator, a condenser comprising an interior volume bounded by a substantially vertical interior surface, a condensate line fluidically coupling the condenser to the evaporator. The interior surface includes undulations projecting inwardly into the interior volume on a second axis perpendicular to a vertical first axis with peaks of the undulations spaced apart along a third axis perpendicular to the first axis and the second axis.

Implementations can include one or more of the following features. The interior volume may have a length along the third axis and a width along the second axis and the length is greater than the width. The peaks of the undulations may be spaced regularly along the third axis. The undulations may have a pitch along the third axis between 0.1 and 1 mm. The undulations may have an amplitude along the second axis between 0.1 and 1 mm. The undulations may have pitch along the third axis and an amplitude along the second axis, and a ratio of the pitch to the amplitude is between about 1:1 to 2:1. The undulations may be sinusoidal waves. The undulations may be a plurality of curved segments in which dK/dS equal to a constant value, where K is an inverse of the radius of curvature of the undulation and S is a distance along the curved segments.

In another aspect, a thermosiphon system includes an evaporator, a condenser comprising a plurality of parallel chambers connected to a common channel, and a condensate line fluidically coupling the common channel of the condenser to the evaporator. The condenser is located at a height above the evaporator with a liquid phase of a working fluid that fills a bottom portion of an interior volume of the condensate line, a top surface of the liquid phase has a non-zero angle relative to horizontal from the condenser to the evaporator, and a vapor phase of the working fluid can pass through a top portion of the interior volume of the condensate line, the top portion extending from the condenser to the evaporator.

In another aspect, a server rack sub-assembly includes a tray configured for slidable insertion into a server rack, a motherboard mounted on the tray and laying in a plane, an underside of the motherboard separated from the tray by a gap, a heat-generating electronic device mounted on a top side of the motherboard, and a thermosiphon system. The thermosiphon system includes an evaporator supported on the heat generating electronic device and a condenser supported on the tray and fluidically coupled to the evaporator. The evaporator has a bottom surface positioned adjacent and thermally conductively coupled to the heat-generating electronic device. The condenser includes a condensate collector positioned above the plane of the motherboard and a plurality of heat conducting fins extending downwardly from the condensate collector below the plane of the motherboard. A fan is mounted on the tray and oriented to generate an airflow over the motherboard and between the fins of the evaporator.

Implementations can include one or more of the following. A second heat-generating electronic device may be mounted on the motherboard, the thermosiphon system may include a second evaporator, and the second evaporator may include a second bottom surface positioned adjacent and thermally conductively coupled to the second heat-generating electronic device. The tray may be configured for insertion into a 13 inch or 19 inch server rack. A total height from a bottom of the tray to a top of the heat conducting fins may be at most 6 inches.

One or more of the following advantages may be realized. The thermosiphon system can fit within the limited horizontal and vertical space of the server rack. A thin layer of liquid can be maintained in the evaporator over the region where the evaporator contacts the electronic device, thus reducing thermal resistance of the evaporator to absorption of heat from the electronic device. In addition, the likelihood of flooding of this region can be reduced, thus reducing the likelihood of failure of the thermosiphon system due to increased thermal resistance. Undulations in the internal surfaces of the condenser can result in a thin layer of liquid, thus reducing the thermal resistance of the condenser, and thereby improving efficiency of radiation of heat out of the thermsiphon system.

The details of one or more implementations are set forth in the accompanying drawings and the description below. Other aspects, features, and advantages of the invention will be apparent from the description and drawings, and from the claims.

DESCRIPTION OF DRAWINGS

Like reference symbols in the various drawings indicate like elements.

DETAILED DESCRIPTION

This document discusses a thermosiphon system that can be implemented to remove heat from an electronic device, e.g., a component of computing equipment, such as a processor or memory. The evaporator of the thermosiphon system contacts the electronic device so that the electronic device experiences a conductive heat transfer effect. Thus, the thermosiphon system can act as a heat sink for the electronic device, reducing the likelihood of overheating and subsequent failure of the electronic device.

In particular, the thermosiphon system can be mounted on or integrated with a server rack sub-assembly for insertion into a server rack. The server rack sub-assembly can contain or support a number of heat-generating electronic devices, and the evaporator of the thermosiphon system can contact one or more of the electronic devices. In addition, the thermosiphon system can be mounted on a circuit card assembly, a daughter card, and/or other boards that carry heat-generating electronic devices.

Figure 1:
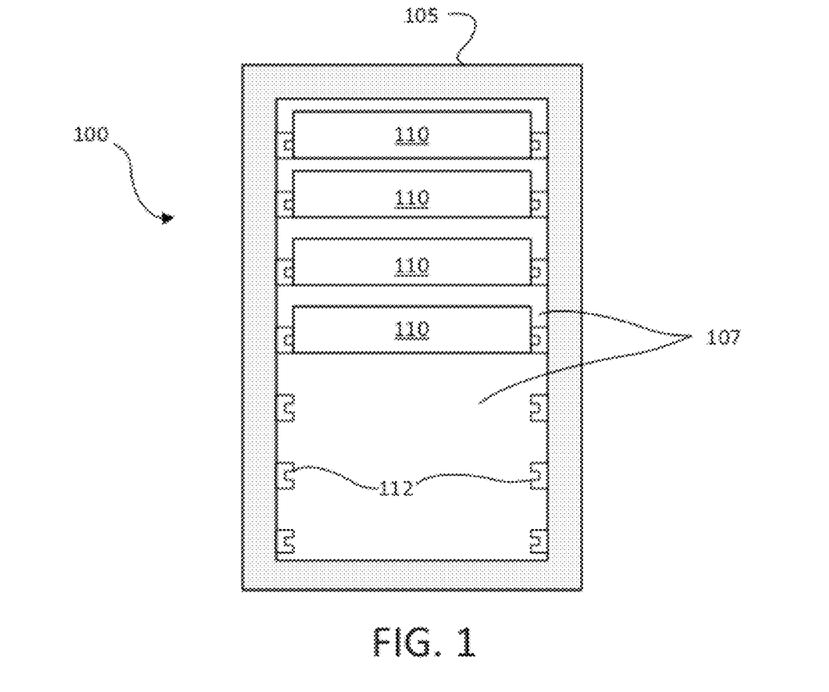
FIG. 1 illustrates a side view of a server rack and a server-rack sub-assembly configured to mount within the rack.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107. The slots, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2:
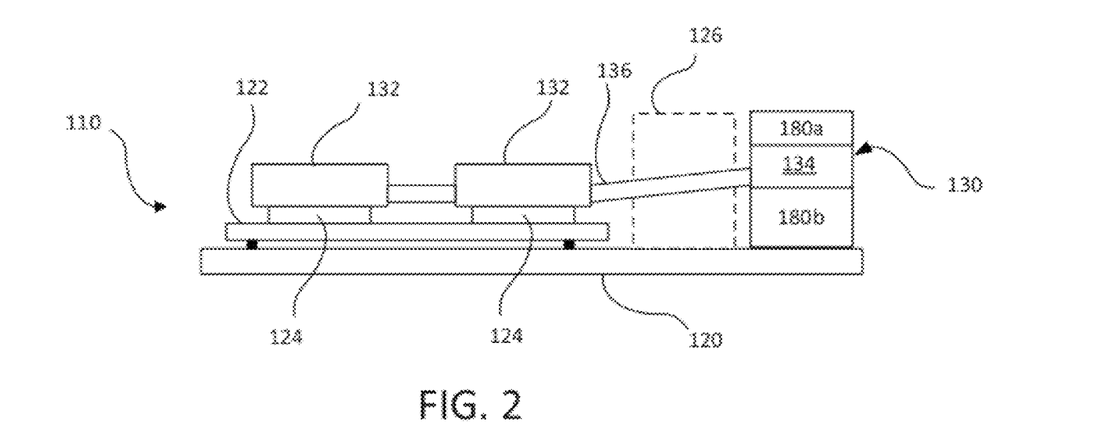
FIGS. 2 and 3 illustrate a side view and a top view of a server rack sub-assembly.
Figure 3:
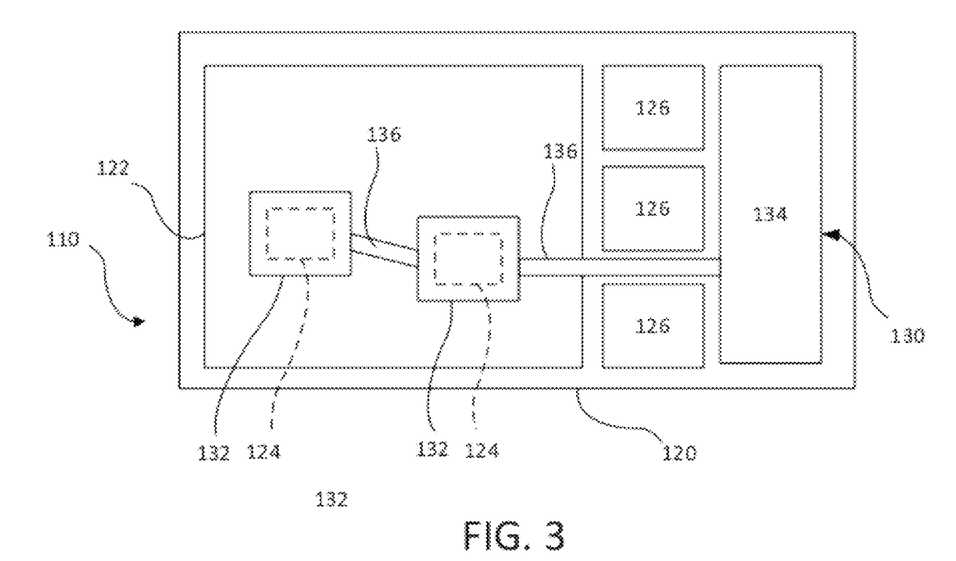
Figure 4:
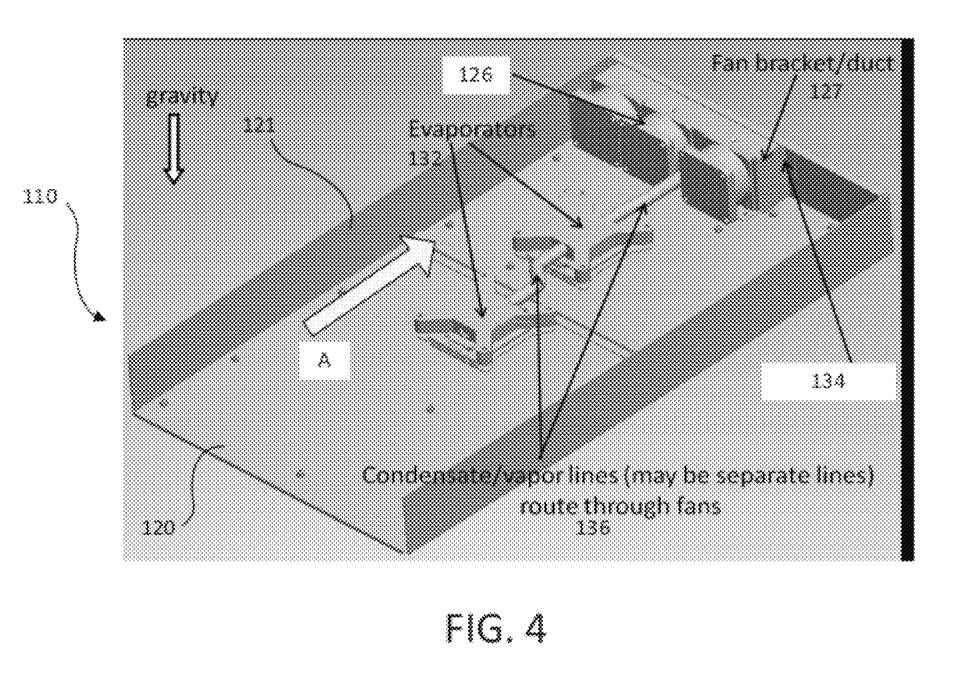
FIG. 4 illustrates a perspective view of a server rack sub-assembly (but omits the printed circuit board and heat generating elements to provide a view of more of the frame).

Referring to FIGS. 2-4, the server rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2 and 3 illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2 illustrates the frame 120 as a flat plate, the frame 120 can include one or more side walls 121 (see FIG. 4) that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIG. 3) of the server rack sub-assembly 110, closer to the front of the rack 105 when the sub-assembly 110 is installed in the rack 105, flows (see arrow A in FIG. 4) over the motherboard and over some of the heat generating components on the motherboard 122, and is exhausted from the server rack assembly 110 at the back edge (at the right hand side in FIG. 3), closer to the back of the rack 105 when the sub-assembly 110 is installed in the rack 105. The one or more fans 126 can be secured to the frame 120 by brackets 127. Thus, the fans 126 can pull air from within the frame 120 area and push the air after it has been warmed out the rack 105. An underside of the motherboard 122 can be separated from the frame 120 by a gap.

The thermosiphon system 130 includes an evaporator 132, a condenser 134, and condensate/vapor lines 136 connecting the evaporator 132 to the condenser 134. The evaporator contacts the electronic device 124 so that heat is drawn by conductive heat transfer from the electronic device 124 to the evaporator 132. In particular, the bottom of the evaporator 132 contacts the top of the electronic device 124. In operation, heat from the electronic device 124 causes a working fluid in the evaporator 132 to evaporate. The vapor then passes through condensate/vapor lines 136 to the condenser 134. Heat is radiated away from the condenser 134, e.g., into air blown or drawn by the one or more fans 126 that passes across the condenser 134, causing the working fluid to condense. As shown in FIG. 2, the condenser 134 can be located on an opposite side of one or more of the one or more fans 126 from the evaporator 132. Alternatively or in addition, the condenser 134 can be located on a same side of one or more of the one or more fans 126 as the evaporator 132.

As shown in FIG. 2, the condensate/vapor line 136 is at a slight (non-zero) angle so that gravity causes the condensed working fluid to flow back through the condensate/vapor lines 136 to the evaporator 132. Thus, in some implementations, at least a portion of the condensate/vapor lines 136 is not parallel to the main surface of the frame 120. For example, the condenser-side end of the condensate/vapor line 136 can be about 1-5 mm, e.g., 2 mm, above the evaporator-side end of the condensate/vapor line 136. However, it is also possible for the condensate/vapor line 136 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 2, there is a first evaporator 132 and a second evaporator 132 as well as a first electronic device 124 and a second electronic device 124. The condensate/vapor line 136 connecting the first evaporator to the second evaporator can be level.

During operation, the top surface of the liquid inside the condenser will be above the top surface liquid height in the evaporator, e.g., by 1 to 10 mm. It can be easier to achieve this with a condensate/vapor line 136 that is at a slight (positive non-zero) angle, but proper selection of the thermal and mechanical properties of the working fluid in view of the expected heat transport requirements for the thermosiphon system may still achieve this for a condensate/vapor line 136 that is horizontal or at a slightly negative angle. During operation, the liquid phase of a working fluid can fill a bottom portion of an interior volume of the condensate/vapor line 136, with the bottom portion extending from the condenser to the evaporator, and a vapor phase of the working fluid can pass through a top portion of the interior volume of the condensate/vapor line 136, with the top portion extending from the condenser to the evaporator.

In some implementations, the condenser 134 can be located at a height above the evaporator 132 such that a liquid phase of the working fluid fills a bottom portion of an interior volume of the condensate/vapor line 136 and such that during operation a top surface of the liquid phase has at a non-zero angle relative to horizontal from the condenser 132 to the evaporator 134, and a vapor phase of the working fluid can pass through a top portion of the interior volume of the condensate/vapor line 136, the top portion extending from the condenser 132 to the evaporator 134.

FIGS. 2-4 illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. As shown in FIGS. 2-4, the multiple evaporators 132 can be connected by the condensate/vapor lines 136 to the condenser 134 in series, i.e., a first condensate/vapor line connects the condenser to a first evaporator, and a second condensate/vapor line connects the first evaporator to a second evaporator. Alternatively, some or all of the multiple evaporators 132 can be connected by the condensate/vapor lines 136 to the condenser 134 in parallel, i.e., a first condensate/vapor line connects the condenser to a first evaporator, and a second condensate/vapor line connects the condenser 134 to a second evaporator. Advantages of a serial implementation is fewer tubes, whereas an advantage of parallel tubes is that the tube diameters can be smaller.

FIGS. 2-4 illustrate a thermosiphon system 130 in which a common line is used for both the condensate flow from the condenser 134 to the evaporator 132 and for vapor flow from the evaporator 132 to the condenser 134. Thus, in this implementation the fluidical coupling between the evaporator 132 and the condenser 134 consists of the combined condensate and vapor transfer line. In some implementations, there can be separate lines for the vapor and the condensate. However, a potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 136 can be a tube or pipe, e.g., of copper or aluminum.

Figure 5:
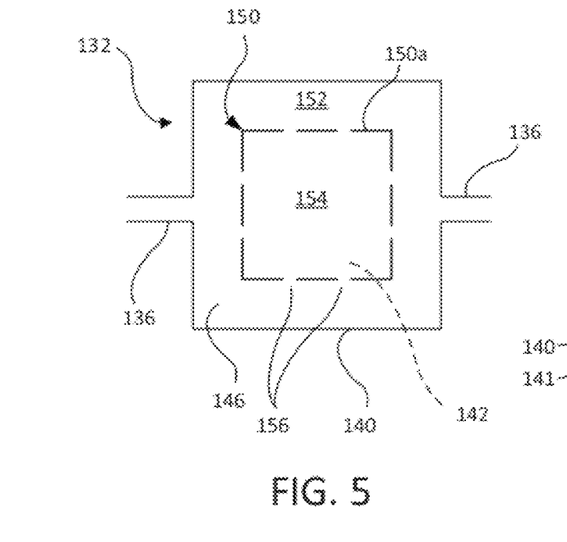
FIGS. 5 and 6 illustrate a top view and a side view, cross-sectional, of an evaporator from the thermosiphon system.
Figure 6:
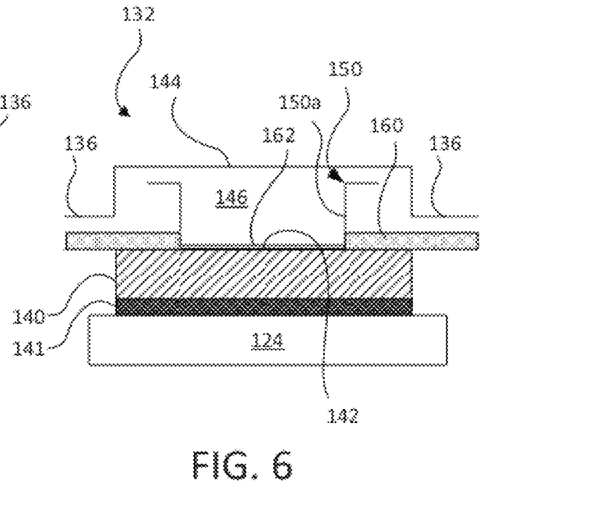
Figure 7:
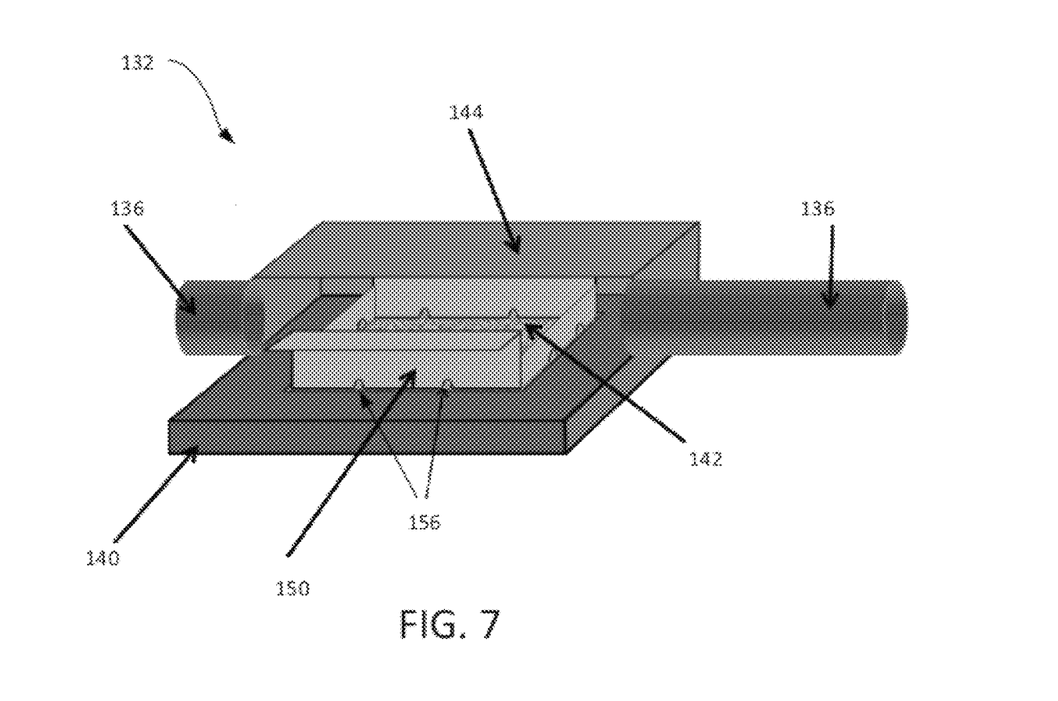
FIG. 7 illustrates a perspective view, partially cut away, of an evaporator from the thermosiphon system.
Figure 8:
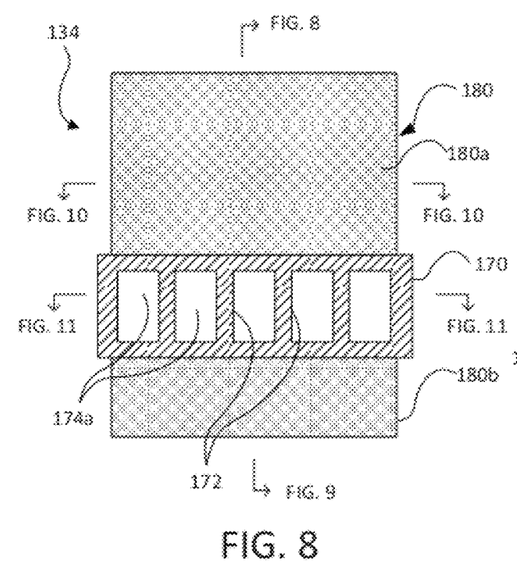
FIGS. 8 and 9 illustrate side views, cross-sectional, of a condenser from the thermosiphon system.
Figure 9:
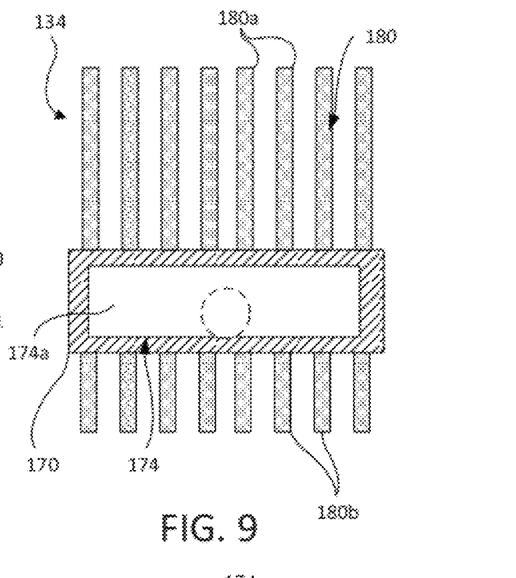
Figure 10:
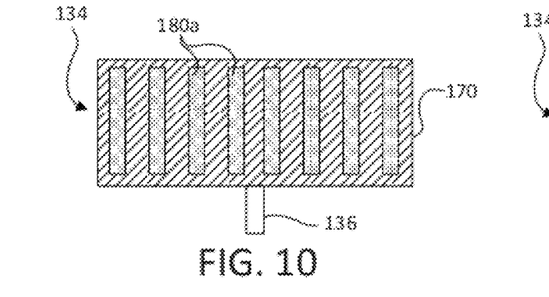
FIGS. 10 and 11 illustrate top views, cross-sectional, of the thermosiphon system of FIGS. 8 and 9.

FIGS. 5-7 illustrate an evaporator 132 that includes a housing that encloses a chamber 146, a wick 142, and a flow restrictor 150. The housing can include a base 140 and a case 144 that is secured to the base 140. The housing has an opening to connect the chamber 146 to the condensate line 136 (or an opening for each line 136 if there are multiple lines 136), but the chamber 146 can otherwise be sealed and fluid-tight.

The flow restrictor 150 is configured to restrict flow of a working fluid from the condensate line 136 onto a portion of the wick 142. In operation, a working fluid 160, in liquid form, flows from the condensate line 136 into the chamber 146 and pools before the flow restrictor 150 (see FIG. 6). The flow restrictor 150 permits a small portion of the working fluid to pass, creating a thin layer 162 of the working fluid 160 on an active area on the bottom interior surface of the housing, e.g., on top of the base 140. By creating a thin layer 162 of the working fluid, the thermal resistance of the evaporator is effectively reduced (because the working fluid can evaporate more readily from a thin layer, permitting greater heat transfer).

The base 140 is formed of a thermally conductive material, e.g., copper. The housing, e.g., the bottom of the base 140, can directly contact the electronic device 124, e.g., the top surface of the electronic device 124. Alternatively, the housing, e.g., the bottom of the base 140, can be connected to the electronic device 124, e.g., the top surface of the electronic device 124, by a thermally conductive interface material 141, e.g., a thermally conductive pad or layer, e.g., a thermally conductive grease or adhesive.

The wick 142 can be formed on the bottom interior surface of the housing, e.g., on the top surface of the base 140. The wick 142 is a thermally conductive area that transfers heat from the base 140 to the working fluid 160. In addition, the wick 142 can be configured to draw the working fluid 160 by capillary action. In some implementations, the wick 142 can be a porous or roughened region of the top surface of the base 140. For example, the wick 142 can be formed from copper particles that are bonded to the top surface of the base 140. For example, copper particles with a mean diameter of 25 microns can deposited to a depth of about 0.25 mm on the top surface of the base 140 and then sintered. Other possibilities for the wick 142 include a porous material that sits on the base 140, microgrooving on the base 140, or a screen wick. Apart from the roughness of the wick 142, the bottom interior surface of the housing can be a planar surface.

The flow restrictor 150 can be a barrier 150a of fluid-impermeable material on the bottom interior surface of the housing between the wick 142 and the opening to the condensate line 136. The barrier 150a partitions the bottom interior surface of the housing into a first portion 152 into which the liquid working fluid can flow easily, and a second portion 154 into which flow of the working fluid is restricted. That is, the working fluid must pass under or through the barrier in order to flow from the first portion 152 to the second portion 154. The first portion 152 can be adjacent the opening to the condensate line 136. The second portion 154 can be positioned directly over the electronic device 124. Thus, the active area of the bottom interior surface of the housing that receives the most heat from the electronic device 124 can be the region in which the thin layer 162 of the working fluid is created.

The barrier 150a can surround part or all of the wick 142, so that the second portion 154 can partially or entirely overlie the wick 142 (the barrier 150a can still be considered to "surround" a portion of the wick 142 when it rests on the wick 142). Optionally, some portion of the wick 142 can extend past the barrier 150a into the second portion 154. In the implementation illustrated in FIGS. 5-7, the barrier 150a and the first portion 152 entirely surround the second portion 154, such as the horizontal plane. However, in some implementations the second portion 154 could abut the housing, e.g., abut the case 144, so that a wall of the housing forms part of the perimeter of the second portion 154, with the barrier 150a providing a remainder of the perimeter.

The flow restrictor 150, e.g., the barrier 150a, can have a plurality of apertures 156 therethrough to permit the liquid working fluid to flow into the second portion 154. The plurality of apertures can be positioned adjacent the bottom interior surface of the housing, e.g., adjacent the top surface of the base 140. The apertures are sized based on the thermal properties of the working fluid and the expected heat transfer of the thermosiphon system such that a small portion of the working fluid passes through the barrier 150a, creating a layer 162 of the working fluid 160 on the active area. In addition or in the alternative, where a portion of the barrier 150a rests on the wick 142, working fluid could be pulled below the barrier 150a through the wick 142 itself.

The barrier 150a dams the working fluid 160 so that a portion of the working fluid pools on a side of the barrier 150a closer to the opening, e.g., over the first portion 152 of the bottom interior surface. In short, the flow restrictor is configured such that a depth of the working fluid is greater over a region of the housing between the barrier and the opening, e.g., over the first portion 152, than over the portion of the wick, e.g., than over the second portion 154.

The housing includes a top interior surface, e.g., provided by the case 144. There can be a gap between the barrier 150a and the top interior surface. The opening from the chamber 144 to the condensate line 136 can be located in an interior side surface of the housing. For example, the opening from the chamber 144 to the condensate line 136 can be positioned adjacent the bottom interior surface of the housing, e.g., adjacent the top surface of the base 140. If a separate vapor line is present, then an opening in the housing to the vapor line can be located in the top interior surface of the housing, e.g, in the ceiling of the case 144, or in a side of the case at a position vertically higher than the opening to the condensate line 136. The case 144 can be a transparent material to permit observation of the interior of the evaporator 132.

Although the housing composed of the base 142 and case 144 illustrated by FIGS. 5-7 is a rectangular solid, this is not required, and the housing could be another right solid, e.g., cylindrical, or some other shape. Similarly, although the first and second portions 152, 154 of the bottom interior surface of the housing are rectangular, other simple polygons, e.g., convex polygons, or non-self-intersecting curved shapes, e.g., circles or ellipses, are possible, and the first and second portions need not be geometrically similar.

The condenser 132 includes a plurality of chambers, and a plurality of heat conducting fins. The chambers can be parallel and vertically-extending. The top ends of the chambers can be closed off, i.e., there is no top header that interconnects the top ends of the chambers.

FIGS. 8-12 illustrate a first implementation of the condenser 134 that has a body 170 having cavity 174 formed therein, and a plurality of walls 172 in the cavity that divide the cavity 174 into a plurality of parallel vertically-extending chambers 174a. The chambers 174a can be parallel and vertically-extending. The top ends of the chambers 174a can be closed off, i.e., there is no top header that interconnects the top ends of the chambers 174a. The walls 172 act as a condensation surface and to conduct heat from the vapor, through the body to the fins.

The cavity 174 also includes a central channel 176 with an opening to the exterior of the body 170 which is coupled to the condensate line 136. The vertically-extending chambers 174a can extend laterally from the central channel 176, and the chambers 174a can extend parallel to the long axis of the body 170 (i.e., the body has a length greater than its width, and the long axis is along the length). The central channel 176 can extend laterally perpendicular to the long axis. When the condenser 134 is installed on the frame, the central channel 176 can run from the front toward the rear of the body 170. A first set of the vertically-extending chambers 174 can extend laterally from a first side of the central channel 176, and a second set of the plurality of vertically-extending chambers 174 can extend laterally from an opposite second side of the central channel 176. The body 170 can be a generally rectangular solid, although other shapes are possible.

FIGS. 8-12 illustrate a first implementation of the condenser 134 that has a plurality of heat conducting fins 180 that project outwardly from the body 170. For example, the fins 180 can project vertically from the body 170. The fins 170 can be generally flat, narrow sheets. The fins 180 can project in parallel to each other from the body 170, and can be spaced apart with a regular pitch along a direction normal to their flat primary surfaces. In some implementations, the fins 180 include at least a first plurality of fins 180a that project upwardly from the top surface of the body 170. In some implementations, the fins 180 also include a second plurality of fins 180b that project downwardly from the bottom surface of the body 170.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis perpendicular to, or at a slight angle to, the long-axis of the chambers 174a and/or the body 170.

Returning to FIG. 2, the condenser 134 can rest on the frame 120, and the fins 180b that project downwardly from the bottom surface of the body 170 can project below the plane of the motherboard 122. This can improve the available surface area for the fins to improve radiating efficiency of the condenser 134. This can also assist in limiting the vertical height of the condenser 134 so that the thermosiphon system 130 is compatible with the limited height available in the server rack environment. For example, a total height from a bottom of the tray to a top of the heat conducting fins can be at most 6 inches, e.g., at most 4 inches.

Figure 13:
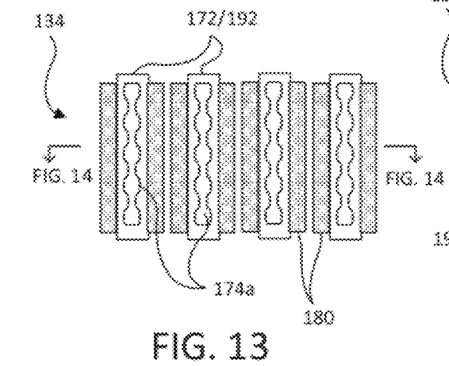
FIGS. 13 and 14 illustrate a top view and a side view, cross-sectional, of another implementation of a condenser.
Figure 14:
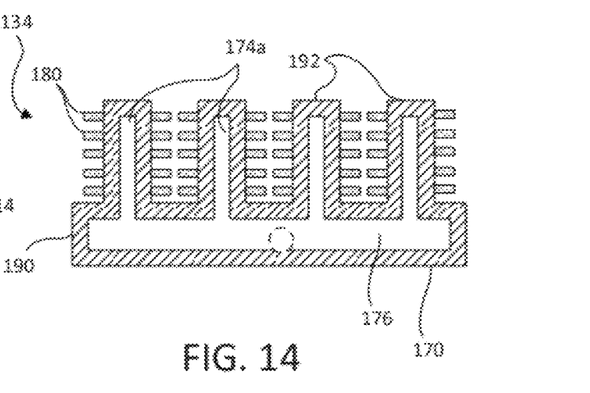
Figure 15:
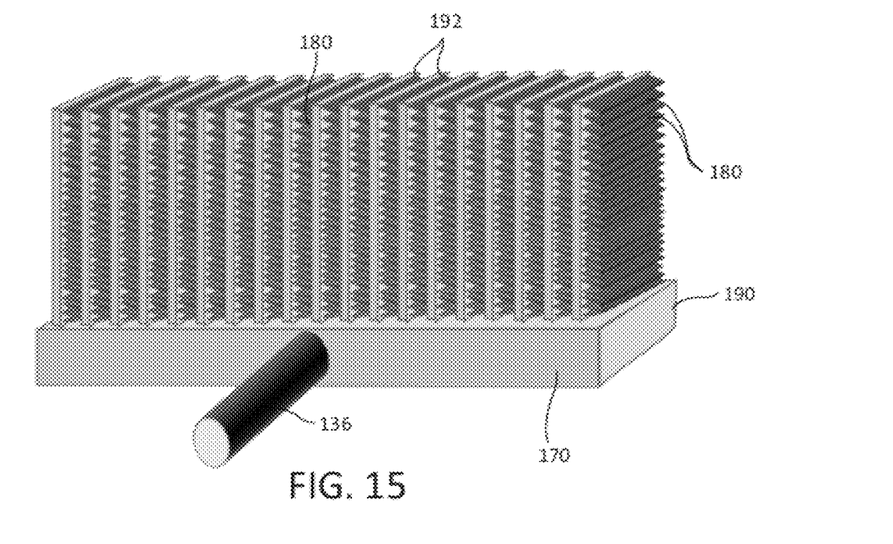
FIG. 15 illustrates a perspective view, cut away, of the other condenser.

FIGS. 13-15, illustrate a second implementation of the condenser 134 that also has a plurality of heat conducting fins 180 that project outwardly from the body 170. However, in this implementation, the vertically-extending chambers 174a extend vertically from the central channel 176. In particular, the body can include a bottom header 190 which contains the central channel 176, and plurality of tubes 192 that project vertically from the bottom header 190 and contain the vertically-extending chambers 174a. The condensate line 136 is fluidically coupled to the bottom header 190 of the condenser 134.

Each chamber 174a can be formed by its own, and the walls 172 that form the boundaries of vertically extending chamber 174a can be walls of the tubes 192. The chambers 174a can extend perpendicular to the long axis of the body 170. Although the vertically extending chambers 174a are connected to a bottom header 190, the top ends of the chambers 174a can be closed off, i.e., the condenser 134 does not include a top header.

The fins 180 can project horizontally from the body 170, e.g., horizontally from the tubes 192. The fins 180 can extend parallel to the long axis of the bottom header 190. The fins 180 can be generally flat, narrow sheets. The fins 180 can project in parallel to each other from the body 170, and can be spaced apart, e.g., vertically spaced apart, with a regular pitch along a direction normal to their flat primary surfaces.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis parallel to the long-axis of the chambers 174a. The chambers 174a canshorter than they are long.

In either implementation of the condenser, both the body 170 of the condenser 134 and the fins 180 can be formed of a material with a good terminal conductivity, comparable or better than aluminum, e.g., of at least 200 W/mK. A nickel plating can be used to solder the fins 180 to the body 170, or the fins 180 can be brazed to the body 170.

Figure 11:
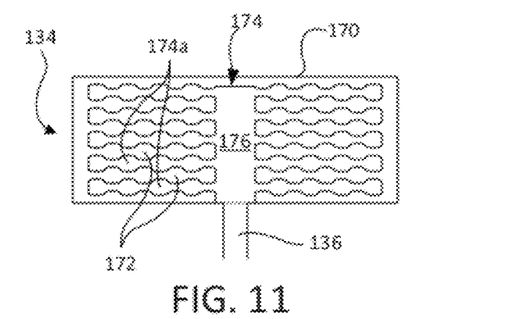
Figure 12:
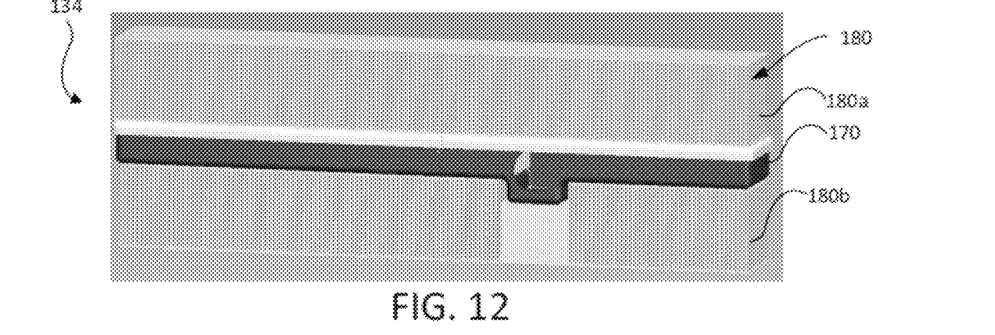
FIG. 12 illustrates a perspective view, cut away, of a condenser from the thermosiphon system.
Figure 16:
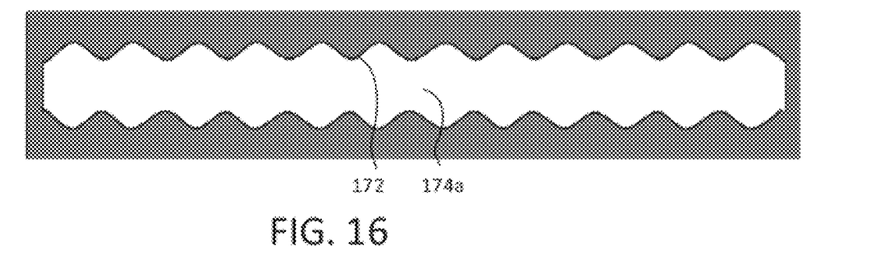
FIG. 16 is an expanded top view, cross-sectional, of a chamber in the condenser.

Referring to FIGS. 11, 13 and 16, at least some interior surfaces of the condenser, e.g., surfaces that bound the cavity 174, can optionally be texturized. The texturization can apply to either implementation of the condenser. The cavity 174 provides an interior volume bounded by a substantially vertical interior surface, e.g., a surface of one of the walls 172. The texturization of the interior surface can include undulations projecting inwardly into the interior volume. The undulations can be uniform along a vertical first axis, and can project into the interior volume along a second axis perpendicular to the vertical first axis. Peaks of the undulations can be spaced apart, e.g., with a regular pitch, along a third axis perpendicular to the first axis and the second axis. The third axis can be parallel to the long axis of the body 170 and/or the chamber 174a. Each chamber 174a can have a length along the third axis and a width along the second axis with the length being greater than the width. The undulations can be smooth, e.g., no discontinuities in the surface along the second axis.

The undulations can have a pitch along the third axis between 0.1 and 1 mm and can have an amplitude along the second axis between 0.1 and 1 mm. In some implementations, a ratio of the pitch to the amplitude is between about 1:1 to 2:1. In some implementations, the undulations can form a sinusoidal wave. In some implementations, the undulations are formed by a plurality of curved segments in which dK/dS is equal to a constant value, where K is an inverse of the radius of curvature of the undulation and S is a distance along a curved segment. Other shapes for the undulations are possible. These undulations can cause thinning of the film of condensed working fluid that forms on the vertical interior surface, thereby reducing the thermal resistance of the condenser.

The working fluid can be a dielectric, non-flammable fluid with low toxicity, although but hydrocarbons such as methanol, ethanol or acetone can also be suitable. The composition of the working fluid and internal pressure of the thermosiphon system can be selected to provide a boiling point of the working fluid in the evaporator at about the desired operating temperature for the electronic devices, e.g., around 30-100° C., e.g., 45-55° C. Examples of the working fluid include Vextral XF sold by DuPont, Flourinet Electronic Liquid FC-72, sold by 3M, and Novec 7100, sold by 3M.

The entire interior of the thermosiphon system 130, including the interior of the evaporator 132, condenser 134 and vapor/condensate line 136, are vacuum filled and sealed. Initial vacuum can be pulled to achieve an internal absolute pressure below 0.05 millibar (5 Pa) to remove air from the thermosiphon system 130, and then the working fluid can be introduced into thermosiphon system 130.

Although a server rack sub-assembly has been described above, the thermosiphon system could be used with heat-generating electronic devices mounted on a motherboard that is not part of a server rack sub-assembly, e.g., on a motherboard in a desktop computer, or could be used with heat-generating electronic devices that are not mounted on a motherboard.

A number of embodiments of the invention have been described. Nevertheless, it will be understood that various modifications may be made without departing from the spirit and scope of the invention. Accordingly, other embodiments are within the scope of the following claims.

What is claimed is:

1. A thermosiphon system, comprising:
   an evaporator;
   a condenser comprising
      a body, the body including
         a length greater than a width and a long axis along the length, and
         a central channel and a plurality of parallel vertically-extending chambers within the body, the chambers having closed off top ends, wherein the chambers are closed off from each other at the top ends, wherein the plurality of parallel vertically-extending chambers extend laterally along the long axis from the central channel, and wherein the central channel extends laterally through the body perpendicular to the long axis; and
   a condensate line fluidically coupling the condenser to the evaporator, the condensate line extending laterally from the condenser body.

2. The thermosiphon system of claim 1, wherein the body has a cavity formed therein and a plurality of walls in the cavity that divide the cavity into the plurality of parallel vertically-extending chambers.

3. The thermosiphon system of claim 2, wherein a first set of the plurality of vertically-extending chambers extend laterally from a first side of the central channel and a second set of the plurality of vertically-extending chambers extend laterally from an opposite second side of the central channel.

4. The thermosiphon system of claim 2, further comprising a plurality of heat conducting fins projecting outwardly from the body.

5. The thermosiphon system of claim 4, wherein the plurality of heat conducting fins project vertically from the body.

6. The thermosiphon system of claim 5, wherein the plurality of heat conducting fins are oriented perpendicular to the vertically-extending chambers.

7. The thermosiphon system of claim 2, wherein the condensate line extends perpendicular to the long axis.

8. The thermosiphon system of claim 7, wherein the condensate line is coupled to an end of the central channel.

9. The thermosiphon system of claim 2, wherein the plurality of walls comprises undulations projecting inwardly into the vertically-extending chambers.

10. The thermosiphon system of claim 9, wherein the undulations project inwardly on a second axis perpendicular to a vertical first axis with peaks of the undulations spaced apart along the long axis.

11. The thermosiphon system of claim 2, wherein the central channel has a same height as the vertically-extending chambers.

12. The thermosiphon system of claim 1, comprising a motherboard, and a heat-generating device mounted on the motherboard, and wherein the evaporator is supported on the heat-generating device.

13. The thermosiphon system of claim 12, comprising a tray configured for slidable insertion into a server rack, the motherboard mounted on the tray and laying in a plane, and wherein the condenser is supported on the tray.

14. The thermosiphon system of claim 13, further comprising a fan mounted on the tray and oriented to generate an airflow over the motherboard and between a plurality of heat conducting fins that project outwardly from the body.

15. The thermosiphon system of claim 12, wherein the heat-generating device comprises a computer chip.

16. A thermosiphon system, comprising:
an evaporator;
a condenser comprising a body, the body including
 a length greater than a width and a long axis along the length,
 a cavity, and
 a plurality of walls in the cavity that divide the cavity into a plurality of parallel vertically-extending chambers, the chambers having closed off top ends, wherein the plurality of vertically-extending chambers extend laterally parallel to the long axis from a central channel, and wherein the central channel extends laterally through the body perpendicular to the long axis; and
a condensate line fluidically coupling the central channel of the condenser to the evaporator, the condensate line extending laterally from the condenser body and the central channel and perpendicular to the chambers.

17. The thermosiphon system of claim 16, wherein the body comprises a floor and an outer side wall extending upward from the floor, and wherein the condensate line is fluidically coupled to the central channel through an aperture in the outer side wall.

18. The thermosiphon system of claim 16, wherein a first set of the plurality of vertically-extending chambers extend laterally from a first side of the central channel and a second set of the plurality of vertically-extending chambers extend laterally from an opposite second side of the central channel.

19. The thermosiphon system of claim 16, further comprising a plurality of heat conducting fins projecting outwardly from the body.

20. The thermosiphon system of claim 16, wherein the condensate line is coupled to an end of the central channel.

21. The thermosiphon system of claim 20, wherein the condensate line is parallel to the central channel.

22. The thermosiphon system of claim 16, wherein the central channel has a same height as the vertically-extending chambers.

23. A thermosiphon system, comprising:
an evaporator;
a condenser comprising
 a body, the body including a floor surface, a top surface, and an outer side wall extending upward from the floor surface,
 a plurality of parallel vertically-extending chambers in the body, the chambers having closed off top ends, and
 a central channel in the body, wherein the central channel comprises two parallel channel walls extending from the bottom surface to the top surface, the channel walls having a plurality of openings from the bottom surface to the top surface, the openings extending laterally off the central channel to the body to create the chambers, each of the chambers having two parallel chamber walls perpendicular to the central channel; and
a condensate line fluidically coupling the central channel of the condenser to the evaporator, the condensate line extending laterally from the body and the central channel and perpendicular to the chamber walls.

* * * * *